(12) United States Patent
Seddon et al.

(10) Patent No.: US 9,852,972 B2
(45) Date of Patent: Dec. 26, 2017

(54) SEMICONDUCTOR DEVICE AND METHOD OF ALIGNING SEMICONDUCTOR WAFERS FOR BONDING

(71) Applicant: SEMICONDUCTOR COMPONENTS INDUSTRIES, LLC, Phoenix, AZ (US)

(72) Inventors: Michael J. Seddon, Gilbert, AZ (US); Francis J. Carney, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/218,848

(22) Filed: Jul. 25, 2016

(65) Prior Publication Data
US 2017/0084595 A1 Mar. 23, 2017

Related U.S. Application Data

(60) Provisional application No. 62/219,666, filed on Sep. 17, 2015.

(51) Int. Cl.
*H01L 29/06* (2006.01)
*H01L 23/498* (2006.01)
(Continued)

(52) U.S. Cl.
CPC .. *H01L 23/49827* (2013.01); *H01L 21/02035* (2013.01); *H01L 21/304* (2013.01);
(Continued)

(58) Field of Classification Search
CPC .......... H01L 23/49827; H01L 23/3107; H01L 23/3114; H01L 23/4822; H01L 23/49503;
(Continued)

(56) References Cited

U.S. PATENT DOCUMENTS 7,897,481 B2 * 3/2011 Chiou ................. H01L 25/0657
257/E21.48
2009/0130821 A1 * 5/2009 Cox ...................... H01L 23/544
438/455

(Continued)

*Primary Examiner* — Yosef Gebreyesus
(74) *Attorney, Agent, or Firm* — Robert D. Atkins; Patent Law Group: Atkins and Associates, P.C.

(57) ABSTRACT

A semiconductor device has a first semiconductor wafer. The first semiconductor wafer is singulated to provide a first wafer section including at least one first semiconductor die or a plurality of first semiconductor die. The first wafer section is a fractional portion of the first semiconductor wafer. An edge support structure is formed around the first wafer section. A second wafer section includes at least one second semiconductor die. The second wafer section can be an entire second semiconductor wafer. The first semiconductor die is a first type of semiconductor device and the second semiconductor die is a second type of semiconductor device. An alignment opening is formed through the first wafer section and second wafer section with a light source projected through the opening. The first wafer section is bonded to the second wafer section with the first semiconductor die aligned with the second semiconductor die.

18 Claims, 11 Drawing Sheets

(51) Int. Cl.
| | |
|---|---|
| H01L 21/48 | (2006.01) |
| H01L 21/3065 | (2006.01) |
| H01L 21/78 | (2006.01) |
| H01L 23/495 | (2006.01) |
| H01L 21/67 | (2006.01) |
| H01L 21/66 | (2006.01) |
| H01L 21/56 | (2006.01) |
| H01L 23/31 | (2006.01) |
| H02M 3/158 | (2006.01) |
| H01L 23/482 | (2006.01) |
| H01L 25/065 | (2006.01) |
| H01L 25/00 | (2006.01) |
| H01L 23/544 | (2006.01) |
| H01L 23/00 | (2006.01) |
| H01L 21/02 | (2006.01) |
| H01L 21/304 | (2006.01) |
| H01L 21/308 | (2006.01) |
| H01L 27/146 | (2006.01) |

(52) U.S. Cl.
CPC ...... *H01L 21/3065* (2013.01); *H01L 21/3083* (2013.01); *H01L 21/486* (2013.01); *H01L 21/4825* (2013.01); *H01L 21/4853* (2013.01); *H01L 21/565* (2013.01); *H01L 21/67069* (2013.01); *H01L 21/78* (2013.01); *H01L 22/12* (2013.01); *H01L 22/26* (2013.01); *H01L 23/3107* (2013.01); *H01L 23/3114* (2013.01); *H01L 23/4822* (2013.01); *H01L 23/4951* (2013.01); *H01L 23/49503* (2013.01); *H01L 23/49541* (2013.01); *H01L 23/49562* (2013.01); *H01L 23/49575* (2013.01); *H01L 23/49811* (2013.01); *H01L 23/49838* (2013.01); *H01L 23/49866* (2013.01); *H01L 23/544* (2013.01); *H01L 23/562* (2013.01); *H01L 24/05* (2013.01); *H01L 25/0655* (2013.01); *H01L 25/0657* (2013.01); *H01L 25/50* (2013.01); *H01L 27/14683* (2013.01); *H02M 3/158* (2013.01); *H01L 27/14625* (2013.01); *H01L 27/14685* (2013.01); *H01L 2223/5446* (2013.01); *H01L 2223/54426* (2013.01); *H01L 2224/04042* (2013.01); *H01L 2224/48091* (2013.01); *H01L 2225/06555* (2013.01); *H01L 2225/06593* (2013.01); *H01L 2225/06596* (2013.01)

(58) Field of Classification Search
CPC ........... H01L 23/4951; H01L 23/49541; H01L 23/49562; H01L 23/49575; H01L 23/49811; H01L 23/49838; H01L 25/50; H01L 25/0657; H01L 25/0655; H01L 21/304; H01L 21/3065; H01L 21/3083; H01L 21/4825; H01L 21/4853; H01L 21/486; H01L 21/565; H01L 21/67069; H01L 21/78; H01L 22/12; H01L 22/26; H01L 23/562; H01L 23/544; H01L 27/14683; H01L 23/49866; H02M 3/158
See application file for complete search history.

(56) References Cited

U.S. PATENT DOCUMENTS

| | | | |
|---|---|---|---|
| 2010/0006972 A1* | 1/2010 | La Tulipe, Jr. | ... H01L 21/02002 257/499 |
| 2012/0013013 A1* | 1/2012 | Sadaka | ............... H01L 23/5384 257/773 |
| 2013/0049173 A1* | 2/2013 | Kerwin | ............ H01L 29/66136 257/655 |
| 2013/0320567 A1* | 12/2013 | Thacker | ............. H01L 25/0652 257/777 |

\* cited by examiner

_US 9,852,972 B2_

SEMICONDUCTOR DEVICE AND METHOD OF ALIGNING SEMICONDUCTOR WAFERS FOR BONDING

CLAIM TO DOMESTIC PRIORITY

The present application claims the benefit of U.S. Provisional Application No. 62/219,666, filed Sep. 17, 2015, entitled "SEMICONDUCTOR PACKAGES AND METHODS" invented by Francis J. CARNEY and Michael J. SEDDON, and which is incorporated herein by reference and priority thereto for common subject matter is hereby claimed.

FIELD OF THE INVENTION

The present invention relates in general to semiconductor devices and, more particularly, to a semiconductor device and method of aligning semiconductor wafers for bonding.

BACKGROUND

Semiconductor devices are commonly found in modern electronic products. Semiconductor devices vary in the number and density of electrical components. Semiconductor devices perform a wide range of functions such as analog and digital signal processing, sensors, transmitting and receiving electromagnetic signals, controlling electronic devices, power management, and audio/video signal processing. Discrete semiconductor devices generally contain one type of electrical component, e.g., light emitting diode (LED), small signal transistor, resistor, capacitor, inductor, diodes, rectifiers, thyristors, and power metal-oxide-semiconductor field-effect transistor (MOSFET). Integrated semiconductor devices typically contain hundreds to millions of electrical components. Examples of integrated semiconductor devices include microcontrollers, application specific integrated circuits (ASIC), standard logic, amplifiers, clock management, memory, interface circuits, and other signal processing circuits.

A semiconductor package may include a plurality of stacked semiconductor die. The semiconductor die can be stacked while still in wafer form, i.e., one die in an upper wafer over a corresponding die in the lower wafer. FIG. 1a shows semiconductor wafer 50 positioned over semiconductor wafer 52. Semiconductor die 54 on wafer 50 must be aligned with semiconductor die 56 on wafer 52. The same alignment is required for all semiconductor die on wafers 50 and 52. FIG. 1b shows semiconductor wafer 50 bonded to semiconductor die wafer 52 with semiconductor die 54 aligned with semiconductor die 56. The alignment between all semiconductor die on wafers 50 and 52 is a difficult process during wafer bonding, particularly for thin wafers and different technology wafers, due to breaking, different coefficients of thermal expansion (CTE), process alignment tolerances, pitch tolerances, and maintaining alignment during the bonding and curing. The variance in physical features from one edge of the whole semiconductor wafer to the opposite edge reduces alignment tolerances and tends to cause many defects and low yield. Aligning more than two semiconductor wafers is a particular problem. One solution involves an active alignment using an optical sensor and lens. The relative position of the wafers is optically monitored and feedback is provided to the alignment equipment. The active alignment is a slow and costly for manufacturing.

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer may contain active and passive electrical components and optical devices, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions. The optical device detects and records an image by converting the variable attenuation of light waves or electromagnetic radiation into electric signals.

Back-end manufacturing refers to cutting or singulating the finished wafer into the individual semiconductor die and packaging the semiconductor die for structural support, electrical interconnect, and environmental isolation. The wafer is singulated using plasma etching, laser cutting tool, or saw blade along non-functional regions of the wafer called saw streets or scribes. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2A:
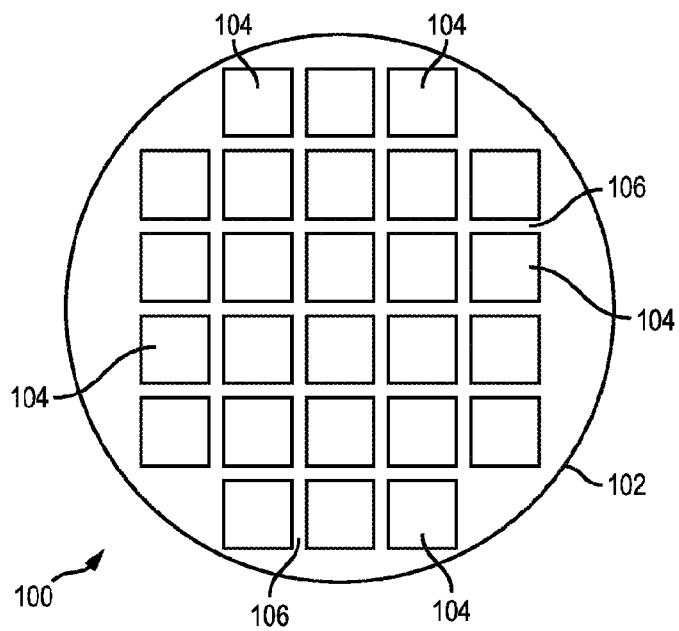
FIGS. 2a-2d illustrate a semiconductor wafer with a plurality of semiconductor die separated by a saw street.

FIG. 2a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material for structural support. A plurality of semiconductor die 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm) and thickness of 50-100 micrometers (μm) or 15-250 μm.

Figure 2B:
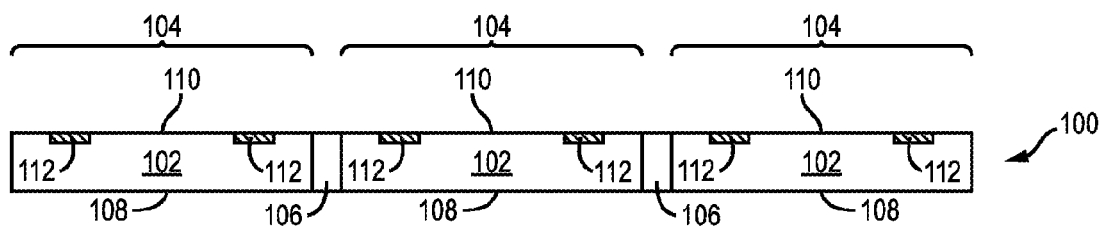

FIG. 2b shows a cross-sectional view of a portion of semiconductor wafer 100. Each semiconductor die 104 has a back or non-active surface 108 and an active surface or region 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface or region 110 to implement analog circuits or digital circuits, such as digital signal processor (DSP), microcontrollers, ASIC, standard logic, amplifiers, clock management, memory, interface circuits, and other signal processing circuit. Semiconductor die 104 may also contain integrated passive devices (IPDs), such as inductors, capacitors, and resistors, for RF signal processing. Active surface 110 may contain an image sensor area implemented as semiconductor charge-coupled devices (CCD) and active pixel sensors in complementary metal-oxide-semiconductor (CMOS) or N-type metal-oxide-semiconductor (NMOS) technologies. Alternatively, semiconductor die 104 can be an optical lens, detector, vertical cavity surface emitting laser (VCSEL), waveguide, stacked die, electromagnetic (EM) filter, or multi-chip module.

An electrically conductive layer 112 is formed over active surface 110 using PVD, CVD, electrolytic plating, electroless plating process, or other suitable metal deposition process. Conductive layer 112 includes one or more layers of aluminum (Al), copper (Cu), tin (Sn), nickel (Ni), gold (Au), silver (Ag), titanium (Ti), titanium tungsten (TiW), or other suitable electrically conductive material. Conductive layer 112 operates as contact pads electrically connected to the circuits on active surface 110. Conductive layer 112 can be formed as contact pads disposed side-by-side along an edge of semiconductor die 104, as shown in FIG. 2b. Alternatively, conductive layer 112 can be formed as contact pads that are offset in multiple rows such that a first row of contact pads is disposed a first distance from the edge of the die, and a second row of contact pads alternating with the first row is disposed a second distance from the edge of the die.

Semiconductor wafer 100 undergoes electrical testing and inspection as part of a quality control process. Manual visual inspection and automated optical systems are used to perform inspections on semiconductor wafer 100. Software can be used in the automated optical analysis of semiconductor wafer 100. Visual inspection methods may employ equipment such as a scanning electron microscope, high-intensity or ultra-violet light, or metallurgical microscope. Semiconductor wafer 100 is inspected for structural characteristics including warpage, thickness variation, surface particulates, irregularities, cracks, delamination, and discoloration.

Figure 2C:
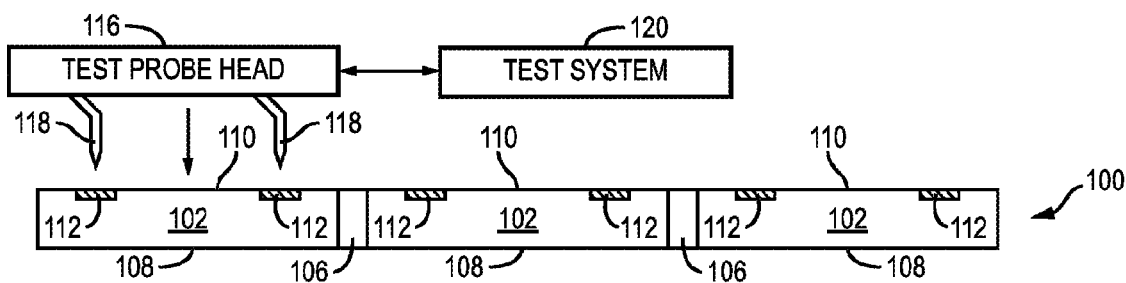

The active and passive components within semiconductor die 104 undergo testing at the wafer level for electrical performance and circuit function. Each semiconductor die 104 is tested for functionality and electrical parameters, as shown in FIG. 2c, using a test probe head 116 including a plurality of probes or test leads 118, or other testing device. Probes 118 are used to make electrical contact with nodes or conductive layer 112 on each semiconductor die 104 and provide electrical stimuli to contact pads 112. Semiconductor die 104 responds to the electrical stimuli, which is measured by computer test system 119 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 100 enables semiconductor die 104 that pass to be designated as known good die for use in a semiconductor package.

Semiconductor wafer 100 is logically divided into wafer sections for singulation. Each wafer section contains one or more semiconductor die 104. Semiconductor die 104 in the wafer section can be made thinner for smaller semiconductor packaging. An edge support ring or structure 124 is formed around the wafer section for structural support of the thin semiconductor die 104 during singulation of the wafer section and other handling of the wafer section. Edge support structure 124 is described in U.S. patent application 2010/0059862, incorporated herein by reference. Semiconductor die 104 is thinner at active surface 110 and thicker at edge support structure 124, making a recess within the edge support structure.

Figure 2D:
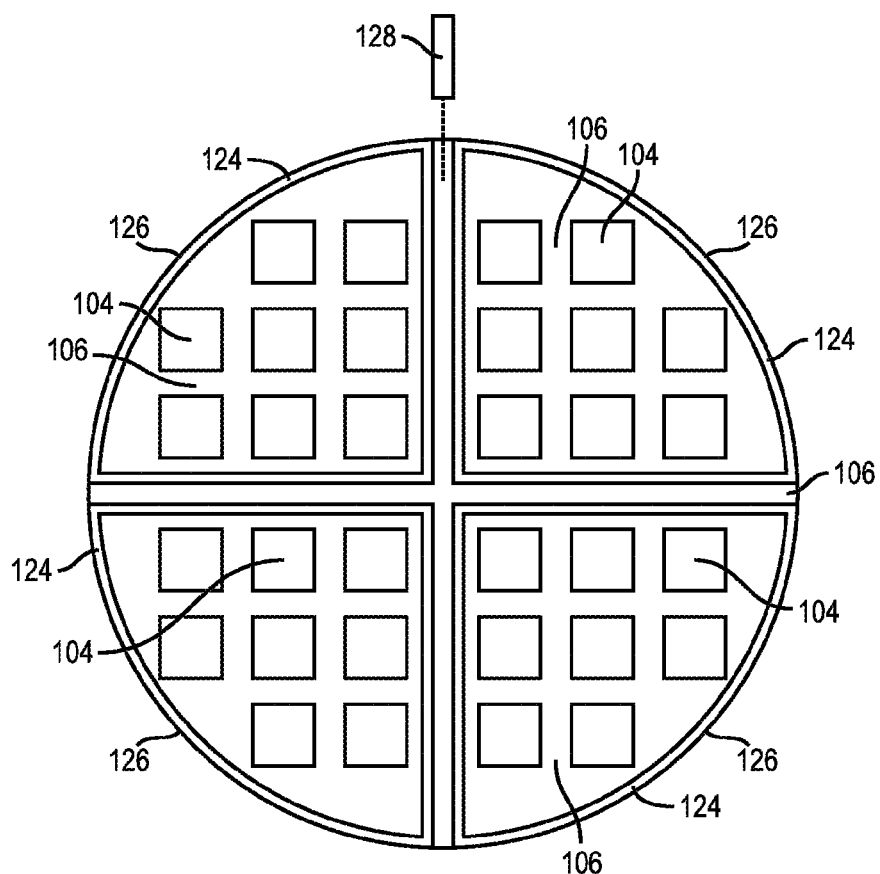

In FIG. 2d, semiconductor wafer 100 is physically singulated through saw street 106 into wafer sections 126 using plasma etching. Plasma etching has advantages of forming precision side surfaces along saw streets 106, while retaining the structure and integrity of the base substrate material. Alternatively, semiconductor wafer 100 is singulated through saw street 106 using a saw blade or laser cutting tool 128 into wafer sections 126. A wafer section 126 represents a physical portion of semiconductor wafer 100 as a group or set of semiconductor die 104 separated by saw street 106, less than the whole wafer. In one embodiment, wafer section 126 is one quarter of semiconductor wafer 100. Wafer section 126 contains 25% of semiconductor die 104 from wafer 100. Alternatively, wafer section 126 can be any other fractional portion of semiconductor wafer 100, including one semiconductor die 104.

Figure 3A:
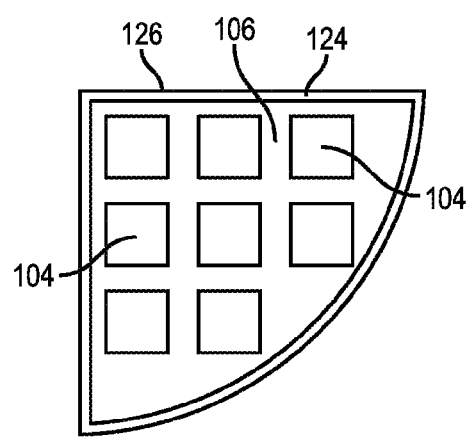
FIGS. 3a-3f illustrate a process of forming stacked semiconductor die by aligning and bonding a fractional portion of a first wafer to a second wafer.

FIGS. 3a-3f illustrate a process of forming stacked semiconductor die by aligning and bonding a fractional portion of a first wafer to a second wafer. FIG. 3a shows wafer section 126 post singulation containing one or more semiconductor die 104 surrounded by edge support structure 124. In the present example, wafer section 126 contains a number of semiconductor die 104 in the same arrangement as semiconductor wafer 100 but embodied as a fractional part of the whole wafer, i.e., one quarter of the wafer. Alternatively, wafer section 126 can be any fractional of semiconductor wafer 100, such as half wafer, eighth wafer, or less, including a single semiconductor die 104.

Figure 3B:
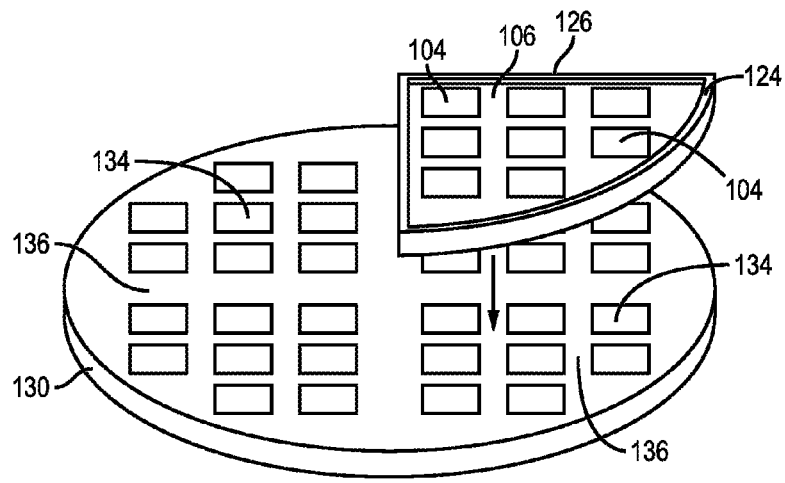

In FIG. 3b, semiconductor wafer 130 contains a plurality of semiconductor die 134 separated by a non-active, inter-die wafer area or saw street 136, as described for semiconductor wafer 100 and semiconductor die 104. Semiconductor die 134 in wafer 130 may be the same type of semiconductor device as semiconductor die 104 in wafer section 126, or semiconductor die 134 may be a different type of semiconductor device than semiconductor die 104. For example, semiconductor die 134 may be a memory controller and semiconductor die 104 may contain memory. Semiconductor die 134 may be an optical sensor and semiconductor die 104 may be a lens. Semiconductor die 134 may be a power transistor and semiconductor die 104 may be control logic.

Figure 3C:
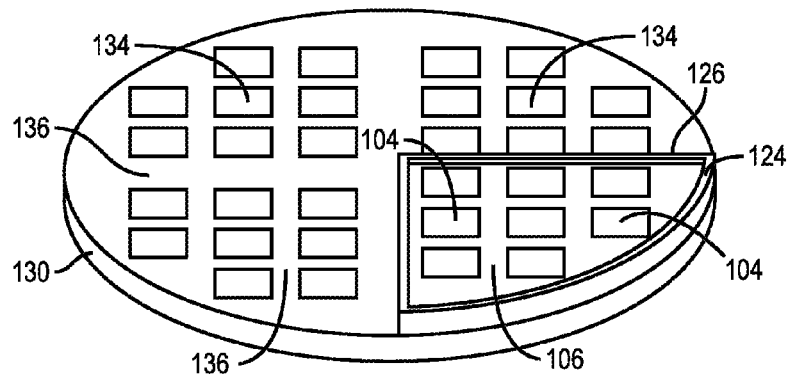

Wafer section 126 is disposed over semiconductor wafer 130 with semiconductor die 104 aligned with semiconductor die 134. More specifically, features of semiconductor die 104 are aligned with features of semiconductor die 134 to enable bonding between wafer section 126 and semiconductor wafer 130 with accuracy orientation between the die for full functionality. The alignment criteria is based on physical features or design parameters. For example, the alignment can be based on relative locations of contact pads between the die for ease of electrical interconnect, positioning of the lens over the optical sensor for optimal focus, minimizing interconnect length for high speed operation, or heat dissipation of the power device to avoid interfering with the control logic. Wafer section 126 can be aligned with semiconductor wafer 130 using openings through the wafer and wafer section and light sensor, see FIGS. 9a-9b. FIG. 3c shows one wafer section 126 bonded to semiconductor wafer 130 with semiconductor die 104 aligned with semiconductor die 134.

Figure 1A:
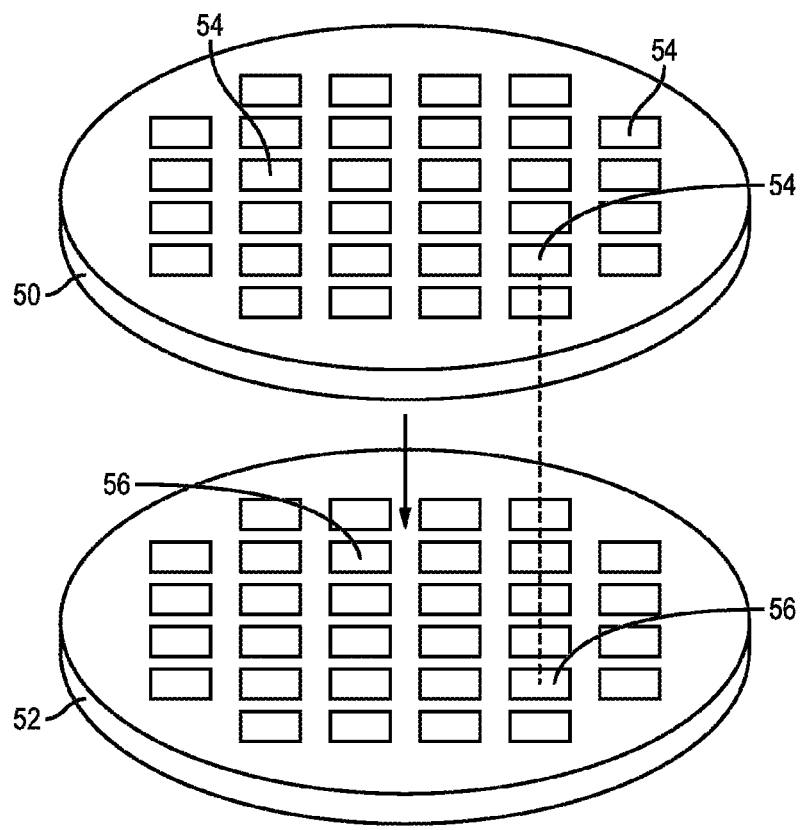
FIGS. 1a-1b illustrates a common wafer to wafer bonding.
Figure 1B:
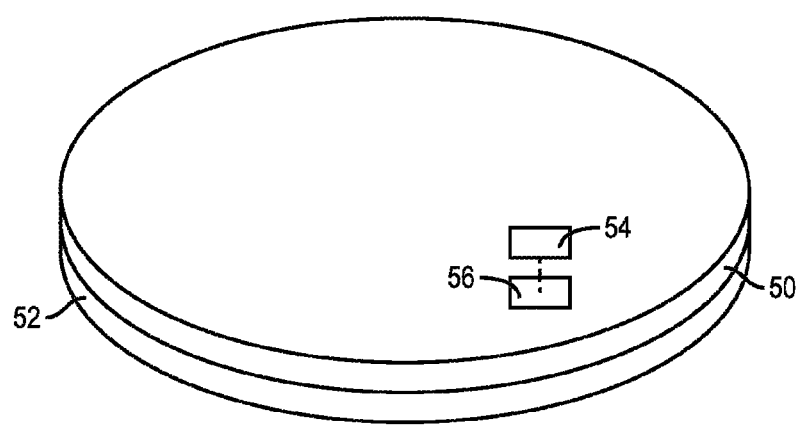

One advantage of aligning and bonding smaller wafer section 126 over the whole semiconductor wafer 130 is small surface area and less variance in structural features working with fewer devices over the smaller distance across the wafer section, i.e., fewer semiconductor die 104 in wafer section 126 than in the whole semiconductor wafer 100. It is easier to align a smaller number of die in a wafer section than the whole semiconductor wafer 100 aligned to the whole semiconductor wafer 130. When working with wafer to wafer bonding as in FIGS. 1a-1b, the variance in structural features and alignment tolerances from one edge of the whole semiconductor wafer to the opposite edge tend to cause alignment defects and low yield. By working with wafer section 126 given the alignment criteria, the smaller surface area of the wafer section simplifies the alignment process by relaxing alignment tolerance with less variance in features over the smaller distance across the wafer section. The smaller wafer section 126 can be aligned and bonded to the whole semiconductor wafer 130 using active or passive alignment with higher alignment accuracy, finer pitch, fewer defects, and improved yield and manufacturability at lower cost, as compared to wafer-to-wafer alignment and bonding. Wafer section 126 can be any fractional portion of semiconductor wafer 100, such as half wafer, quarter wafer, eighth wafer, or less, including a single semiconductor die 104. Wafer section 126 can be rectangular or wedge shaped.

Figure 3D:
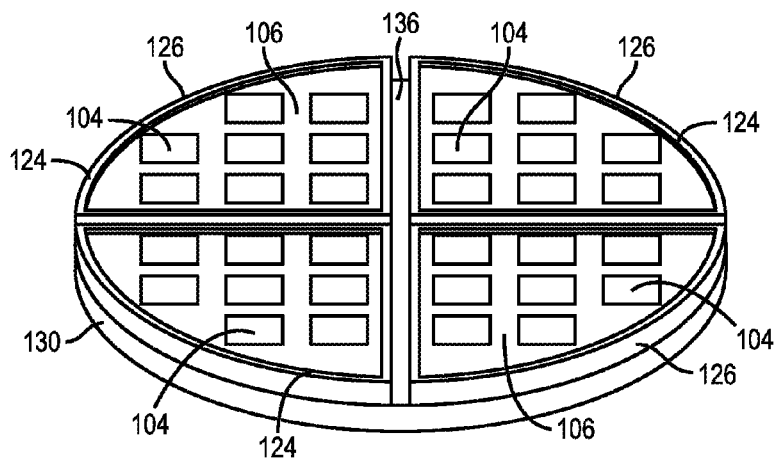

FIG. 3d shows four quarter-wafer sections 126 bonded to semiconductor wafer 130 with semiconductor die 104 in the wafer section aligned with semiconductor die 134 in wafer 130. The four quarter-wafer sections 126 provide full coverage of the whole semiconductor wafer 130.

Figure 3E:
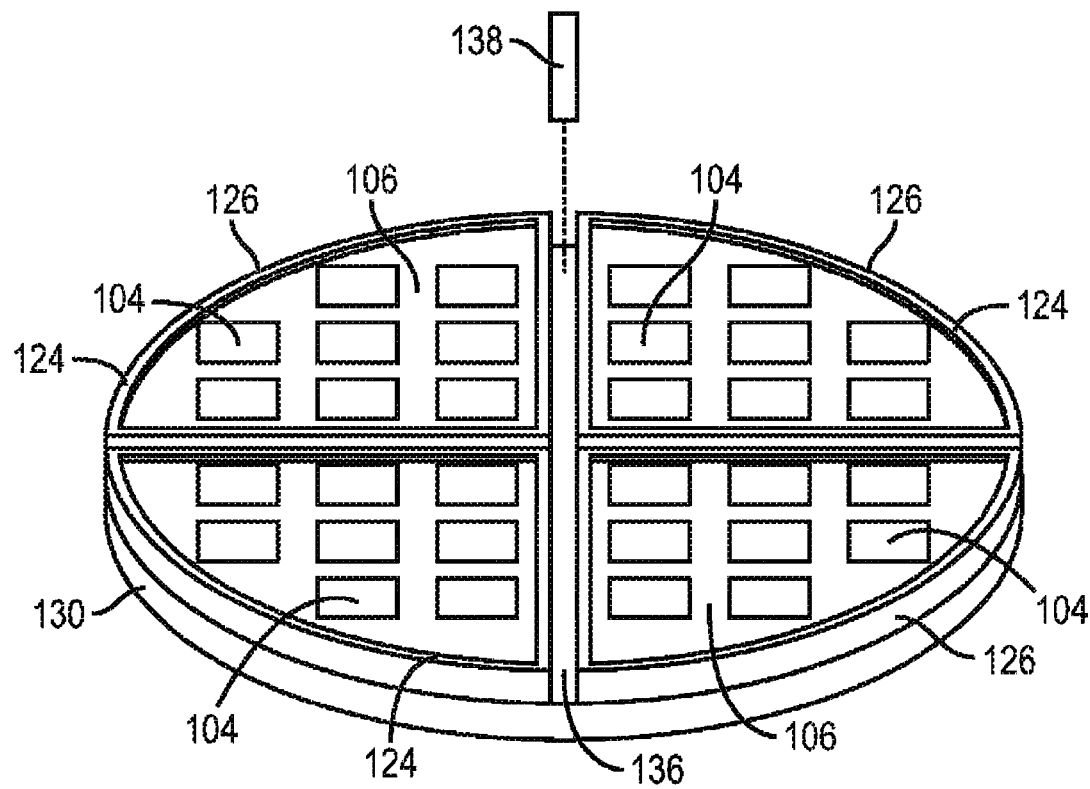
Figure 3F:
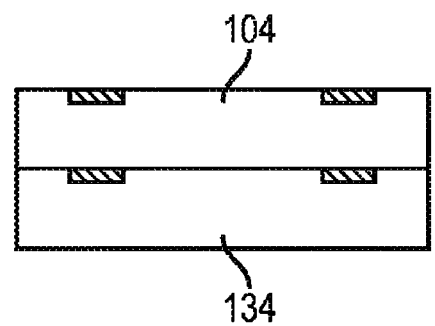

In FIG. 3e, the bonded pairs of wafer sections 126 and semiconductor wafer 130 are physically singulated through saw streets 106 and 136 into individual stacked semiconductor die 104 and 134 using plasma etching. Plasma etching has advantages of forming precision side surfaces along saw streets 106 and 136, while retaining the structure and integrity of the base substrate material. Alternatively, the bonded pairs of wafer sections 126 and semiconductor wafer 130 are singulated through saw streets 106 and 136 using a saw blade or laser cutting tool 138 into individual stacked semiconductor die 104 and 134. FIG. 3f shows stacked semiconductor die 104 and 134 in an aligned and bonded configuration. The stacked semiconductor die 104 and 134 can be inspected and electrically tested for identification of known good die post singulation.

Figure 4A:
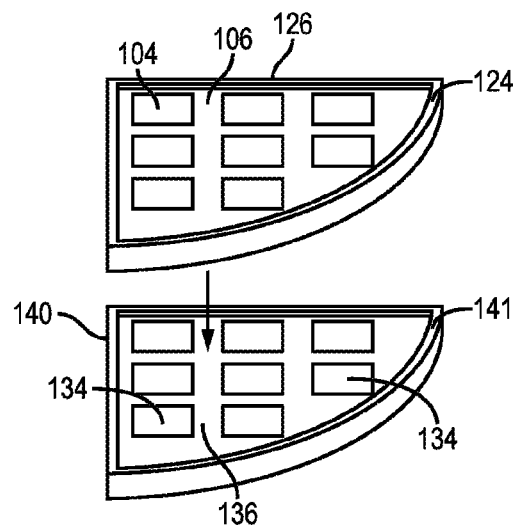
FIGS. 4a-4c illustrate a process of forming stacked semiconductor die by aligning and bonding a fractional portion of a first wafer to a fractional portion of a second wafer.
Figure 4B:
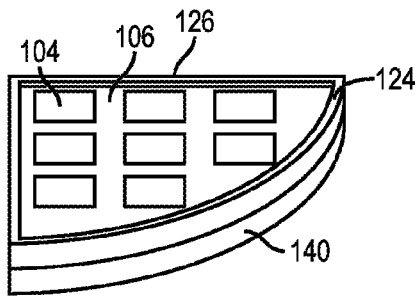
Figure 4C:
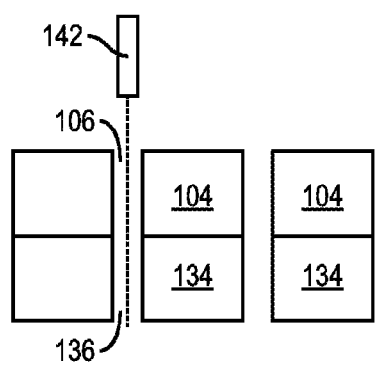

FIGS. 4a-4c illustrate another process of forming stacked semiconductor die by aligning and bonding a fractional portion of a first wafer to a fractional portion of a second wafer. Semiconductor wafer 130 from FIG. 3b is physically singulated through saw street 136 into wafer sections 140 using plasma etching. Plasma etching has advantages of forming precision side surfaces along saw streets 136, while retaining the structure and integrity of the base substrate material. Alternatively, semiconductor wafer 130 is singulated through saw street 136 using a saw blade or laser cutting tool into wafer sections 140. A wafer section 140 represents a physical portion of semiconductor wafer 130 as a uni-body group or set of semiconductor die 134 separated by saw street 136, less than the whole wafer. In one embodiment, wafer section 140 is one quarter of semiconductor wafer 130 surrounded by edge support structure 141, see FIG. 4a. Wafer section 140 contains 25% of semiconductor die 134 from wafer 130. Alternatively, wafer section 140 can be any other fractional portion of semiconductor wafer 130, including one semiconductor die 134.

Wafer section 126 is disposed over wafer section 140 with semiconductor die 104 aligned with semiconductor die 134. More specifically, features of semiconductor die 104 are aligned with features of semiconductor die 134 to enable bonding between wafer section 126 and semiconductor wafer 130 with accuracy orientation between the die for full functionality. The alignment criteria is based on physical features or design parameters. For example, the alignment can be based on relative locations of contact pads between the die for ease of electrical interconnect, positioning of the lens over the optical sensor for optimal focus, minimizing interconnect length for high speed operation, or heat dissipation of the power device to avoid interfering with the control logic. Wafer section 126 can be aligned with wafer section 140 using openings through the wafer sections and light sensor, see FIGS. 9a-9b. FIG. 4b shows one wafer section 126 bonded to wafer section 140 with semiconductor die 104 aligned with semiconductor die 134.

One advantage of aligning and bonding smaller wafer section 126 over wafer section 140 is small surface area and less variance in structural features working with fewer devices over the smaller distance across the wafer sections, i.e., fewer semiconductor die 104 in wafer section 126 and fewer semiconductor die 134 in wafer section 140 than in the whole semiconductor wafers 100 and 130. It is easier to align a smaller number of die in a wafer section than the whole semiconductor wafer 100 aligned to the whole semiconductor wafer 130. When working with wafer to wafer bonding, the variance in structural features and alignment tolerances from one edge of the whole semiconductor wafer to the opposite edge tend to cause alignment defects and low yield, see FIGS. 1a-1b. By working with wafer sections 126 and 140 given the alignment criteria, the smaller surface area of the wafer section simplifies the alignment process by relaxing alignment tolerance with less variance in features over the smaller distance across the wafer section. The smaller wafer section 126 can be aligned and bonded to wafer section 140 using active or passive alignment with higher alignment accuracy, finer pitch, fewer defects, and improved yield and manufacturability at a lower cost, as compared to wafer-to-wafer alignment and bonding. Wafer section 126 can be aligned with wafer section 140 using openings through the wafer and wafer section and light sensor, see FIGS. 9a-9b. Wafer section 126 can be any fractional portion of semiconductor wafer 100, such as half wafer, quarter wafer, eighth wafer, or less, including a single semiconductor die 104. Wafer section 126 can be rectangular or wedge shaped.

In FIG. 4c, the bonded pairs of wafer sections 126 and 140 are physically singulated through saw streets 106 and 136 into individual stacked semiconductor die 104 and 134 using plasma etching, similar to FIG. 3f. Plasma etching has advantages of forming precision side surfaces along saw streets 106 and 136, while retaining the structure and integrity of the base substrate material. Alternatively, the bonded pairs of wafer sections 126 and 140 are singulated through saw streets 106 and 136 using a saw blade or laser cutting tool 142 into individual stacked semiconductor die 104 and 134.

Figure 5A:
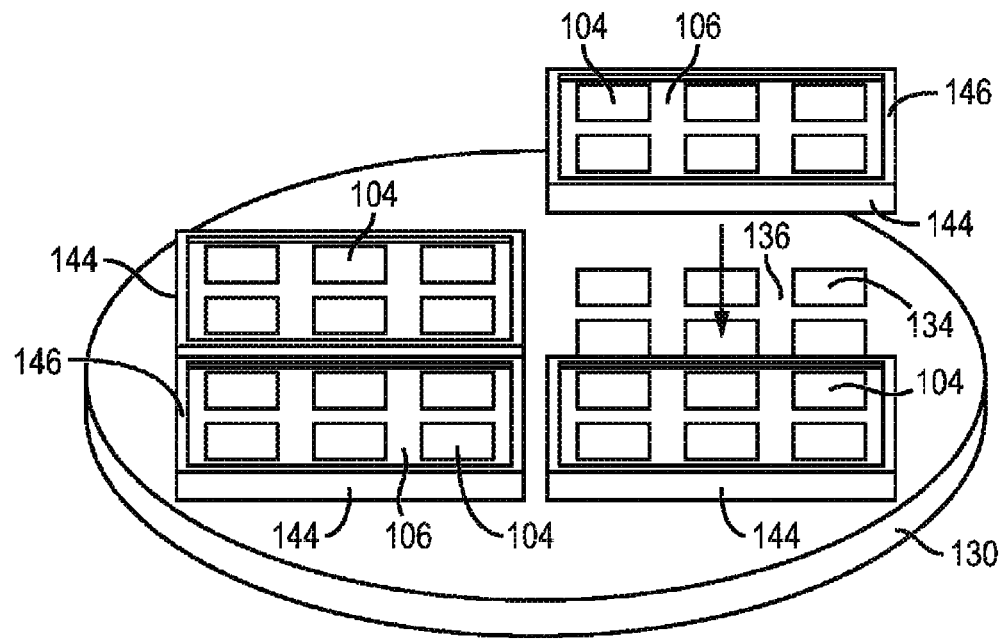
FIGS. 5a-5b illustrate another process of forming stacked semiconductor die by aligning and bonding a fractional portion of a first wafer to a second wafer.
Figure 5B:
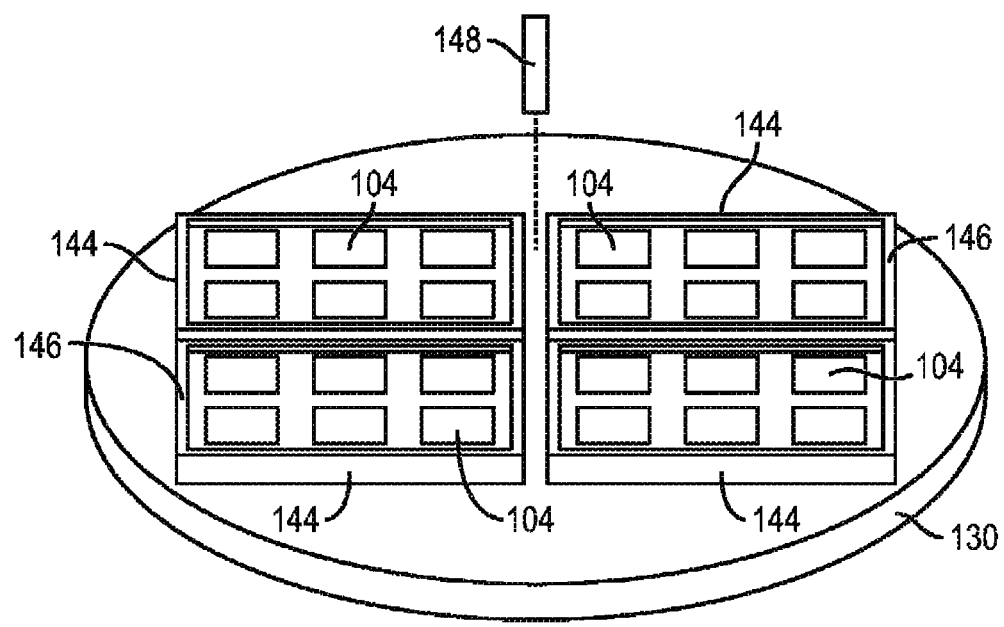

FIGS. 5a-5b illustrate another process of forming stacked semiconductor die by aligning and bonding a fractional portion of a first wafer to a second wafer. In FIG. 5a, each wafer section 144 contains a uni-body group or set of semiconductor die 104 singulated from wafer 100 separated by saw street 106 in a rectangular form factor. Semiconductor die 104 in wafer section 144 are made thin for smaller semiconductor packaging. An edge support structure 146 is formed around wafer section 144 for structural support of the thin semiconductor die 104 during singulation of the wafer section and other handling of the wafer section. Wafer section 144 is thinner at active surface 110 and thicker at edge support structure 146, making a recess in the wafer section within the edge support structure.

Four rectangular wafer sections 144 bonded to semiconductor wafer 130 with semiconductor die 104 in the wafer section aligned with semiconductor die 134 in wafer 130. Semiconductor die 134 in wafer 130 may be the same type of semiconductor device as semiconductor die 104 in wafer section 144, or semiconductor die 134 may be a different type of semiconductor device than semiconductor die 104. The four rectangular wafer sections 144 provide substantial coverage of the whole semiconductor wafer 130.

In FIG. 5b, the bonded pairs of wafer sections 144 and semiconductor wafer 130 are physically singulated through saw street 106 into individual stacked semiconductor die 104 and 134 using plasma etching. Plasma etching has advantages of forming precision side surfaces along saw streets 106, while retaining the structure and integrity of the base substrate material. Alternatively, the bonded pairs of wafer sections 144 and semiconductor wafer 130 are singulated through saw street 106 using a saw blade or laser cutting tool 148 into individual stacked semiconductor die 104 and 134, similar to FIG. 3f.

Wafer section 144 has a small surface area and less variance in structural features over the smaller distance across the wafer section to relax alignment tolerance. The smaller wafer section 144 can be aligned and bonded to the whole semiconductor wafer 130 using active or passive alignment with higher alignment accuracy, finer pitch, fewer defects, and improved yield and manufacturability at a lower cost, as compared to wafer-to-wafer alignment and bonding.

Figure 6A:
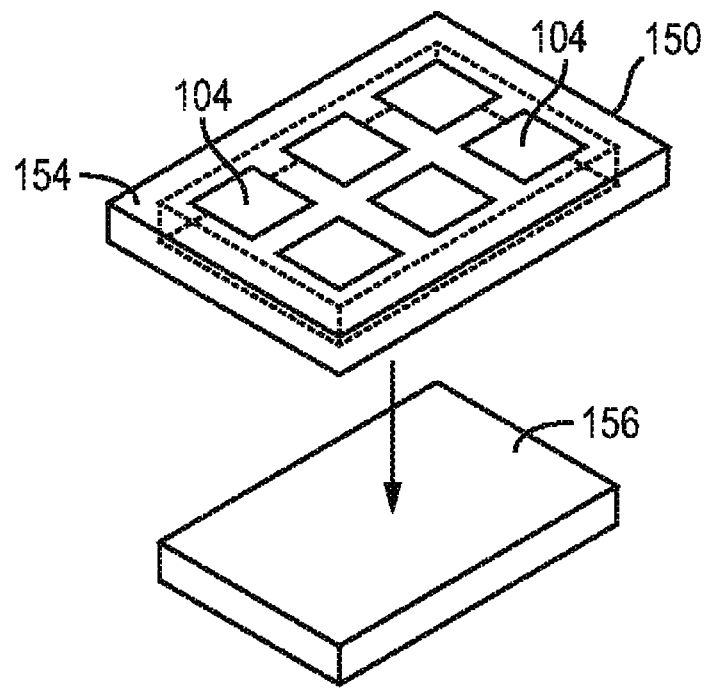
FIGS. 6a-6b illustrate a process of aligning and bonding a first type of semiconductor die to a fractional portion of a wafer containing a second type of die.
Figure 6B:
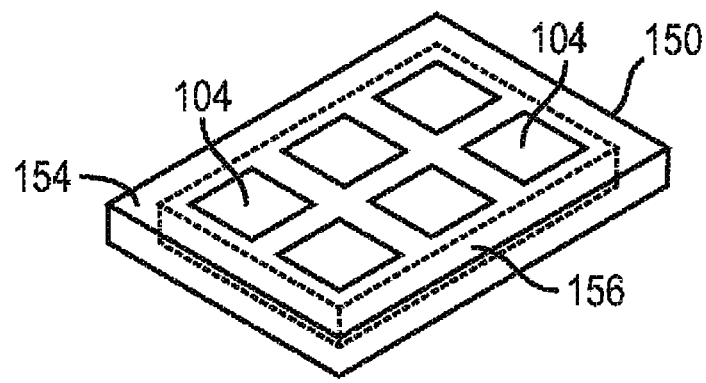

FIGS. 6a-6b illustrate a process of forming stacked semiconductor die by aligning and bonding a first type of semiconductor die to a fractional portion of a wafer. In FIG. 6a, wafer section 150 contains a uni-body group or set of semiconductor die 104 separated by saw street 106 in a rectangular form factor. Semiconductor die 104 in wafer section 150 are made thin for smaller semiconductor packaging. An edge support structure 154 is formed around wafer section 150 for structural support of the thin semiconductor die 104 during singulation of the wafer section and other handling of the wafer section. Wafer section 150 is thinner at the active surface and thicker at edge support structure 154, making a recess in the wafer section within the edge support structure.

Semiconductor die 156, or wafer section 156 containing multiple semiconductor die, is singulated from a wafer, similar to FIG. 2a. Semiconductor die 156 is a different type of semiconductor device than semiconductor die 104. For example, semiconductor die 156 may be a memory controller and semiconductor die 104 may contain memory. Semiconductor die 156 may be an optical sensor and semiconductor die 104 may be a lens. Semiconductor die 156 may be a power transistor and semiconductor die 104 may be control logic.

Semiconductor die 156 is positioned over semiconductor die 104 in wafer section 150 and aligned with active or passive alignment. Semiconductor die 156 are bonded to semiconductor die 104 at least partially in the recess within edge support structure 154. FIG. 6b shows semiconductor die 156 aligned and bonded to semiconductor die 104 in wafer section 150.

The bonded wafer section 150 and semiconductor die 156 can be singulated through saw street 106 into individual stacked semiconductor die 104 and 156 using plasma etching. Plasma etching has advantages of forming precision side surfaces along saw streets 106, while retaining the structure and integrity of the base substrate material.

Figure 7A:
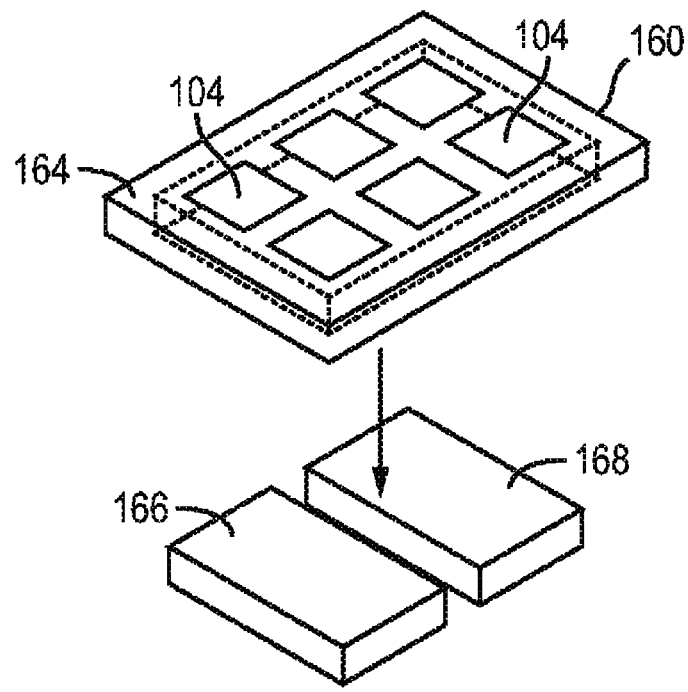
FIGS. 7a-7b illustrate a process of aligning and bonding a first type of die and second type of die to a fractional portion of a wafer containing a third type of die.
Figure 7B:
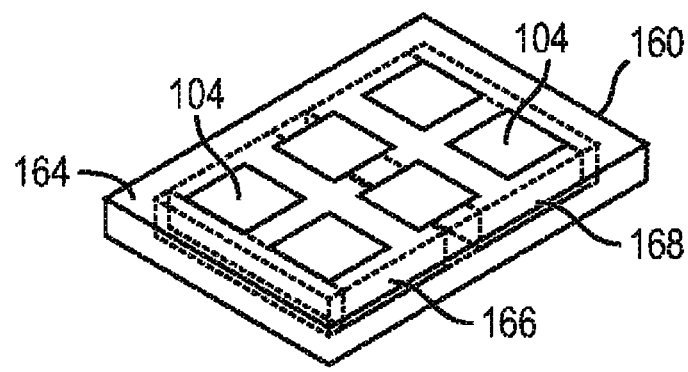

FIGS. 7a-7b illustrate a process of forming stacked semiconductor die by aligning and bonding a first type of semiconductor die and second type of semiconductor die to a fractional portion of a wafer. In FIG. 7a, wafer section 160 contains a uni-body group or set of semiconductor die 104 separated by saw street 106 in a rectangular form factor. Semiconductor die 104 in wafer section 160 are made thin for smaller semiconductor packaging. An edge support structure 164 is formed around wafer section 160 for structural support of the thin semiconductor die 104 during singulation of the wafer section and other handling of the wafer section. Wafer section 160 is thinner at active surface 110 and thicker at edge support structure 164, making a recess in the wafer section within the edge support structure.

Semiconductor die 166 are singulated from a first type of wafer, and semiconductor die 168 are singulated from a second type of wafer, similar to FIG. 2a. Semiconductor die 166 and 168 are each a different type of semiconductor device than semiconductor die 104. Semiconductor die 166 is a different type of semiconductor device than semiconductor die 168. Semiconductor die 166 and 168 are each a different type of semiconductor device than semiconductor die 104.

Semiconductor die 166 and 168 are positioned over different semiconductor die 104 in wafer section 160 and aligned with active or passive alignment. Semiconductor die 166 and 168 are bonded to respective semiconductor die 104 at least partially in the recess within edge support structure 164. FIG. 7b shows semiconductor die 166 and 168 aligned and bonded to respective semiconductor die 104 in wafer section 150.

The bonded wafer section 160 and semiconductor die 166 and 168 can be singulated through saw street 106 into individual stacked semiconductor die 104 and 166 and individual stacked semiconductor die 104 and 168 using plasma etching. Plasma etching has advantages of forming precision side surfaces along saw streets 106, while retaining the structure and integrity of the base substrate material.

Figure 8A:
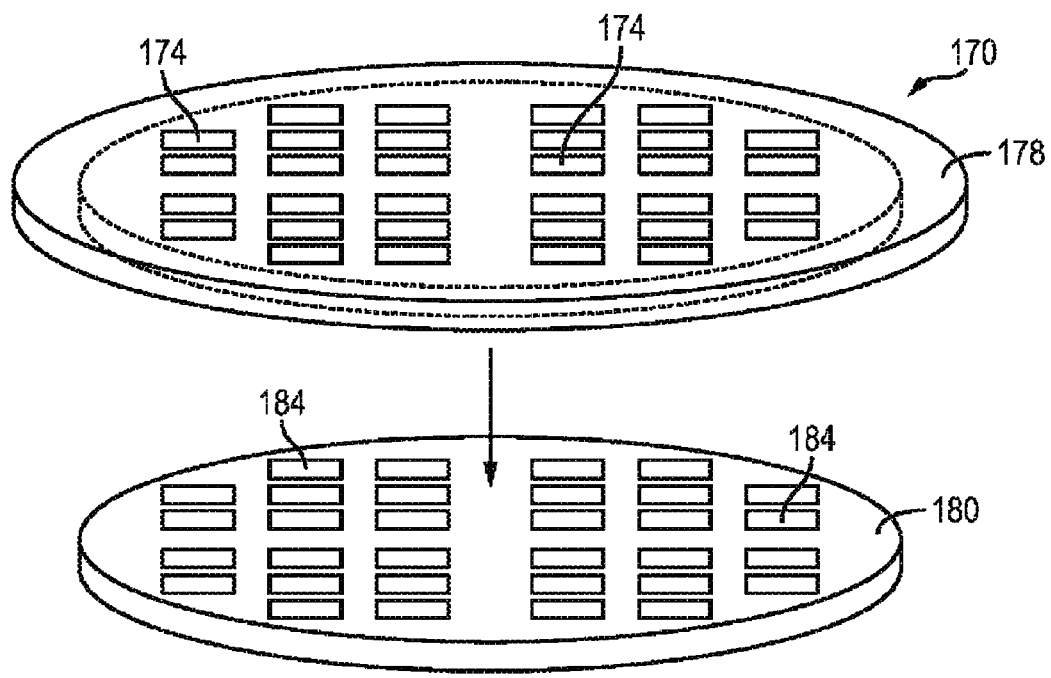
FIGS. 8a-8b illustrate a process of aligning and bonding a first type of semiconductor wafer to a second type of semiconductor wafer.
Figure 8B:
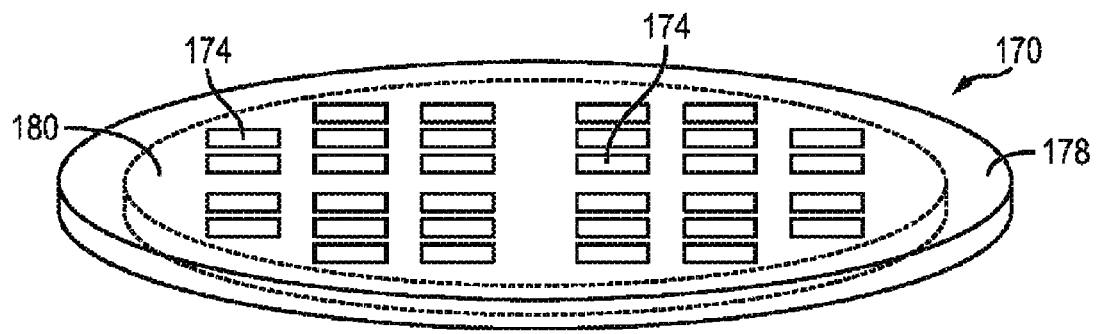

FIGS. 8a-8b illustrate a process of forming stacked semiconductor die by aligning and bonding a first type of semiconductor wafer to a second type of semiconductor wafer. In FIG. 8a, semiconductor wafer 170 contains semiconductor die 174 with saw street 176, similar to FIG. 2a. Semiconductor die 174 are made thin for smaller semiconductor packaging. An edge support structure 178 is formed around semiconductor wafer 170 for structural support of the thin semiconductor die 174 during singulation of the wafer section and other handling of the wafer section. Semiconductor wafer 170 is thinner at the active surface and thicker at edge support structure 178, making a recess in the wafer within the edge support structure.

Semiconductor wafer 180 contains semiconductor die 184 with saw street 186, similar to FIG. 2a. Semiconductor die 184 are a different type of semiconductor device than semiconductor die 174. Semiconductor wafer 170 is positioned over semiconductor wafer 180 and aligned by fitting wafer 180 within edge support structure 178 of wafer 170. Semiconductor die 184 are bonded to semiconductor die 174 at least partially in the recess within edge support structure 178. FIG. 7b shows semiconductor wafer 180 aligned and bonded to semiconductor wafer 170.

The bonded wafers 170-180 are physically singulated through saw streets 176 and 186 into individual stacked semiconductor die 174 and 184 using plasma etching. Plasma etching has advantages of forming precision side surfaces, while retaining the structure and integrity of the base substrate material. Alternatively, the bonded wafers 170-180 are singulated through saw streets 176 and 186 using a saw blade or laser cutting tool into individual stacked semiconductor die 174 and 184, similar to FIG. 3f.

Figure 9A:
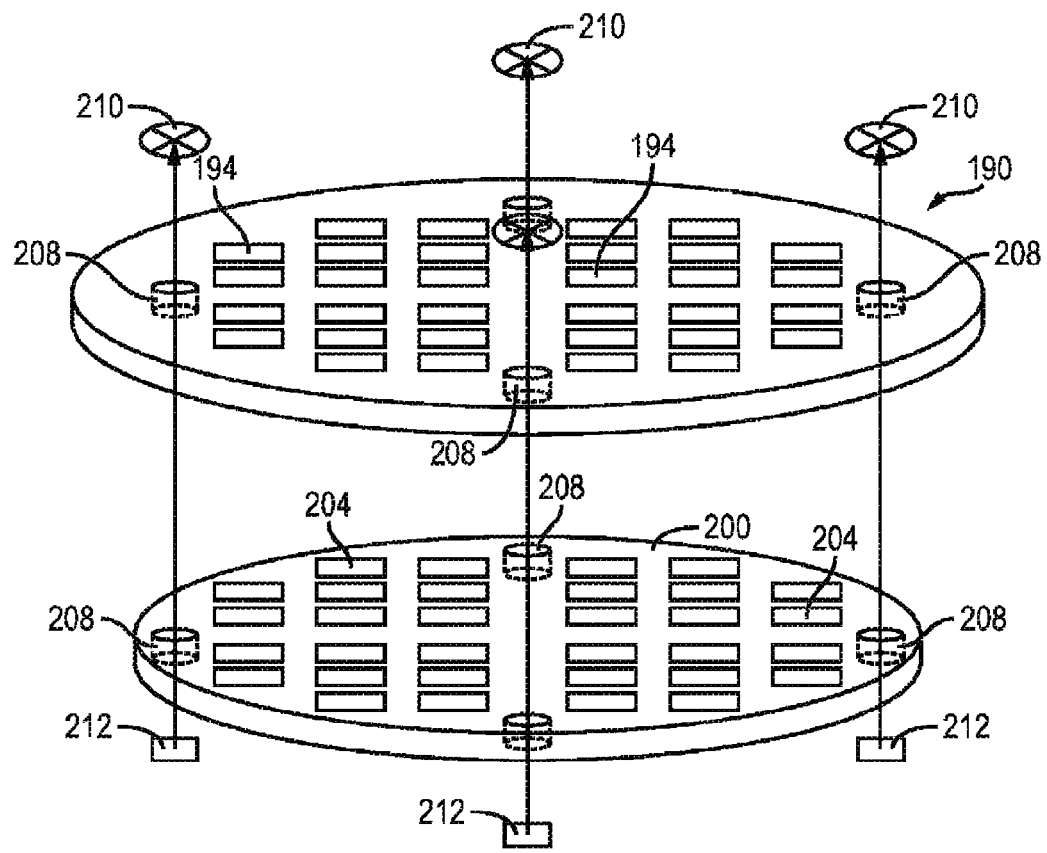
FIGS. 9a-9b illustrate a process of aligning and bonding a first type of wafer to a second type of wafer with a sensor detecting light through an opening.
Figure 9B:
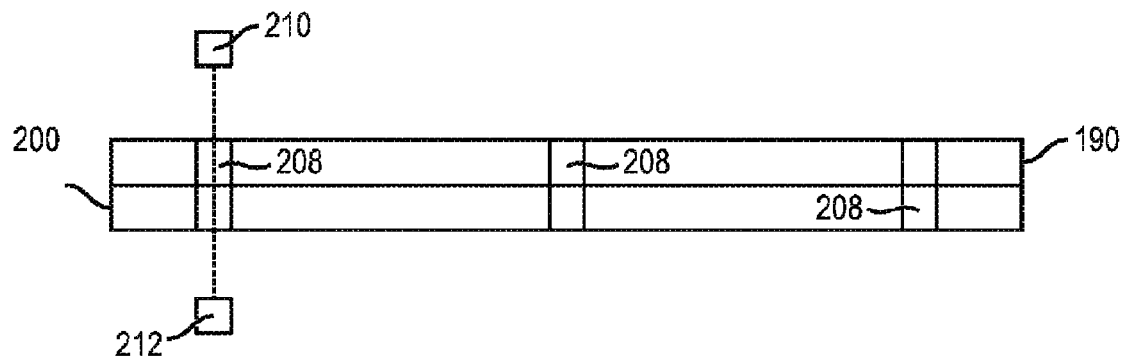

FIGS. 9a-9b illustrate a process of forming stacked semiconductor die by aligning and bonding a first type of semiconductor wafer to a second type of semiconductor wafer. In FIG. 9a, semiconductor wafer 190 contains semiconductor die 194 with saw street 196, similar to FIG. 2a.

Semiconductor wafer 200 contains semiconductor die 204 with saw street 206, similar to FIG. 2a. Semiconductor die 204 are a different type of semiconductor device than semiconductor die 194. Semiconductor wafer 190 is positioned over semiconductor wafer 200. Alignment openings 208 are formed through semiconductor wafers 190 and 200 at key alignment locations. Openings 208 can be formed by plasma etching, laser drilling, or other etching process. Light sources 210 project light through alignment openings 208 to sensors 212. When sensors 212 detect the light through openings 208, semiconductor wafers 190 and 200 are aligned. Semiconductor die 204 are bonded to semiconductor die 194. Alternatively, semiconductor wafers 190 and 200 are aligned with pins. FIG. 9b shows semiconductor wafer 200 aligned and bonded to semiconductor wafer 190.

The bonded wafers 190-200 are physically singulated through saw streets 196 and 206 into individual stacked semiconductor die 194 and 204 using plasma etching. Plasma etching has advantages of forming precision side surfaces, while retaining the structure and integrity of the base substrate material. Alternatively, the bonded wafers 190-200 are singulated through saw streets 196 and 206 using a saw blade or laser cutting tool into individual stacked semiconductor die 194 and 204, similar to FIG. 3f.

While one or more embodiments have been illustrated and described in detail, the skilled artisan will appreciate that modifications and adaptations to those embodiments may be made without departing from the scope of the present disclosure.

What is claimed:

1. A method of making a semiconductor device, comprising:
    providing a first semiconductor wafer;
    singulating the first semiconductor wafer into a plurality of first wafer sections, wherein each of the plurality of first wafer sections includes a plurality of first semiconductor die;
    providing a second wafer section including a plurality of second semiconductor die; and
    bonding the plurality of first wafer sections to portions of the second wafer section with the plurality of first semiconductor die each aligned respectively with the plurality of second semiconductor die.

2. The method of claim 1, wherein each of the first wafer sections is a fractional portion of the first semiconductor wafer.

3. The method of claim 1, wherein the first semiconductor die is a first type of semiconductor device and the second semiconductor die is a second type of semiconductor device.

4. The method of claim 1, wherein the second wafer section is an entire second semiconductor wafer.

5. The method of claim 1, further including forming an alignment opening through each of the first wafer sections and second wafer section.

6. The method of claim 1, further including forming an edge support structure around each of the first wafer sections.

7. A method of making a semiconductor device, comprising:
    providing a plurality of first wafer sections each including a plurality of first semiconductor die;
    providing a second wafer section including a plurality of second semiconductor die; and
    bonding the plurality of first wafer sections to the second wafer section to align the first semiconductor die to the second semiconductor die.

8. The method of claim 7, wherein each of the first wafer sections is a fractional portion of a first semiconductor wafer.

9. The method of claim 7, wherein the second wafer section is an entire second semiconductor wafer.

10. The method of claim 7, further including forming an alignment opening through each of the first wafer sections and second wafer section.

11. The method of claim 7, further including forming an edge support structure around each of the first wafer sections.

12. The method of claim 7, wherein the first semiconductor die is a first type of semiconductor device and the second semiconductor die is a second type of semiconductor device.

13. A semiconductor device, comprising:
    a plurality of first wafer sections each including a plurality of first semiconductor die; and
    a second wafer section including a plurality of second semiconductor die, wherein the first wafer sections are bonded to the second wafer section to align the first semiconductor die to the second semiconductor die.

14. The semiconductor device of claim 13, wherein each of the first wafer sections is a fractional portion of a first semiconductor wafer.

15. The semiconductor device of claim 13, wherein the second wafer section is an entire second semiconductor wafer.

16. The semiconductor device of claim 13, further including an alignment opening formed through each of the first wafer sections and second wafer section.

17. The semiconductor device of claim 13, further including an edge support structure formed around each of the first wafer sections.

18. The semiconductor device of claim 13, wherein the first semiconductor die is a first type of semiconductor device and the second semiconductor die is a second type of semiconductor device.

* * * * *